Oct. 18, 1960 F. J. HIERHOLZER, JR 2,957,121

AMPLIFIER

Filed July 29, 1958 2 Sheets-Sheet 1

WITNESSES

Edwin E. Bassler

Myron E. Click

INVENTOR

Frank J. Hierholzer, Jr.

BY F. E. Browder

ATTORNEY

Oct. 18, 1960 F. J. HIERHOLZER, JR 2,957,121

AMPLIFIER

Filed July 29, 1958 2 Sheets-Sheet 2

United States Patent Office 2,957,121
Patented Oct. 18, 1960

2,957,121

AMPLIFIER

Frank J. Hierholzer, Jr., Monroeville, Pa., assignor to Westinghouse Electric Corporation, East Pittsburgh, Pa., a corporation of Pennsylvania Filed July 29, 1958, Ser. No. 751,660
10 Claims. (Cl. 323—23)

This invention relates to amplifiers in general, and in particular, to static power amplifiers which may amplify either an alternating or direct current signal.

The advent of a semiconductor diode having such characteristics that on exceeding certain specified reverse current and voltage, the diode becomes highly conductive and thereafter will carry a substantial reverse current at low voltages, has led to many new electronic applications. The phenomena described above, is not a Zener breakdown, nor is it an avalanche breakdown. This unique breakdown characteristic can be repeated indefinitely. This breakdown has been designated as a hyperconductive breakdown and a diode having such a characteristic will be referred to hereinafter as hyperconductive diode.

An example of such a hyperconductive diode with controllable reversible breakdown characteristics or hyperconductive breakdown may be constructed from the following elements. A first base element consists of a semiconductor member doped with an impurity to provide a first type of semiconductivity, either N or P. Upon this first base is an emitter consisting of semiconductor material doped with the opposite type of semiconductivity. This emitter may be prepared by alloying a pellet containing a doping impurity to a wafer of semiconductor material forming the first base. An emitter junction is present at the zone between the first base and the emitter.

In order to facilitate the connecting of the hyperconductive diode into an electrical circuit, a layer of silver or other good conductor material may be fused, alloyed into, or soldered with the upper surface of the emitter. Copper lead wires may be readily soldered to this layer.

A second base of opposite conductivity is provided next to the first base. A zone where the first and second base meet forms a collector junction.

Next to the second base is a mass-of-metal which is a source of carriers that play a critical part in the functioning of the diode. This mass-of-metal may be controlled or it may have the same doping characteristics as the second base. The mass-of-metal may be applied to the second base by a soldering, alloying, fusing or other similar well-known method.

Such a hyperconductive semiconductor diode is described in a copending application Serial No. 642,743, entitled "Semiconductor Diode," filed February 27, 1957, and assigned to the same assignee as the present invention. For a more detailed description of the construction, characteristics, and operation of such a hyperconductive diode, reference is made to the above copending application, Serial No. 642,743.

Another example of such a hyperconductive diode with controllable reversible breakdown characteristics may be found by referring to the article entitled "The Four Layer Diode," by Dr. William G. Shockley, in Electronic Industries and Tele Tech, August 1957, pages 58 to 60, 161 to 165. The diode described in this article is comprised of PNPN or NPNP layers of semiconductive material rather than a PNP mass-of-metal or NPN mass-of-metal diode as described in the above referenced copending application.

It is an object of this invention to provide an improved amplifier circuit.

It is another object of this invention to provide an improved amplifier circuit which may amplify either an alternating current or a direct current signal.

It is still another object of this invention to provide an improved switching apparatus which may be used to switch current to a load at a desired time during a half-cycle of a supply voltage.

Further objects of this invention will become apparent from the following description when taken in conjunction with the accompanying drawing. In said drawing for illustrative purposes only, there is shown a preferred form of the invention.

Figure 1:
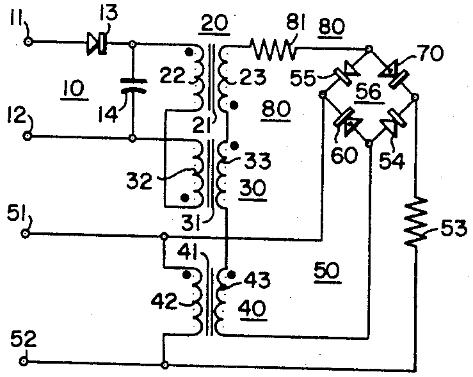
Figure 1 is a schematic diagram of an amplifier apparatus embodying the teachings of this invention.

Referring to Fig. 1, there is illustrated a schematic diagram illustrating the teachings of this invention of an amplifier circuit which comprises in general a load circuit 50, a control circuit 80, and an input circuit 10.

The load circuit 50 includes a bridge arrangement 56 which has hyperconductive diodes 60 and 70 in a first set of opposing legs of the bridge 56 and rectifier diodes 54 and 55 in a second set of opposing legs of the bridge 56. A pair of terminals 51 and 52 are provided for connecting an alternating current supply voltage. The terminal 51 is connected through the hyperconductive diode 60, the rectifier 54 and a load 53 to the terminal 52 for one load path. A second load path connects the terminal 52 through the load 53, the hyperconductive diode 70 and the rectifier 55 to the terminal 51. The load circuit 50 provides an alternating current voltage to the control circuit 80 by means of a transformer 40. The transformer 40 comprises a core 41 having inductively disposed thereon a primary winding 42 and a secondary winding 43. A pair of saturable reactors 20 and 30 couple the input circuit 10 to the control circuit 80. The saturable reactors 20 and 30 are presented as one form of any magnetic amplifier which will regulate the application of breakdown voltage to the hyperconductive diodes 60 and 70 in response to an input signal. The saturable reactor 20 comprises a saturable magnetic core 21 having inductively disposed thereon a primary winding 22 and a secondary winding 23. The saturable reactor 30 comprises a saturable magnetic core 31 having inductively disposed thereon a primary winding 32 and a secondary winding 33.

The control circuit 80 comprises a series circuit including a current limiting resistor 81, the secondary winding 23, the secondary winding 33 and the secondary winding 43 connected across a first pair of opposing terminals of the bridge arrangement 56 as opposed to the load circuit 50 being connected across the second pair of the opposing terminals of bridge arrangement 56.

The rectifiers 54 and 55 have a dual function. First, the rectifiers 54 and 55 prevent current flow from the load circuit 50 through the hyperconductive diodes 60 and 70 in the forward direction. Secondly, the rectifiers 54 and 55 effectively isolate the control circuit 80 from the load circuit 50.

The input circuit 10 comprises a pair of terminals 11 and 12 having series connected therebetween a rectifier 13, the primary winding 22 and the primary winding 32. A filtering capacitor 14 is connected across the input terminals 11 and 12 and the rectifier 13. An alternating current or a direct current input voltage is to be applied to the terminals 11 and 12.

Figure 2:
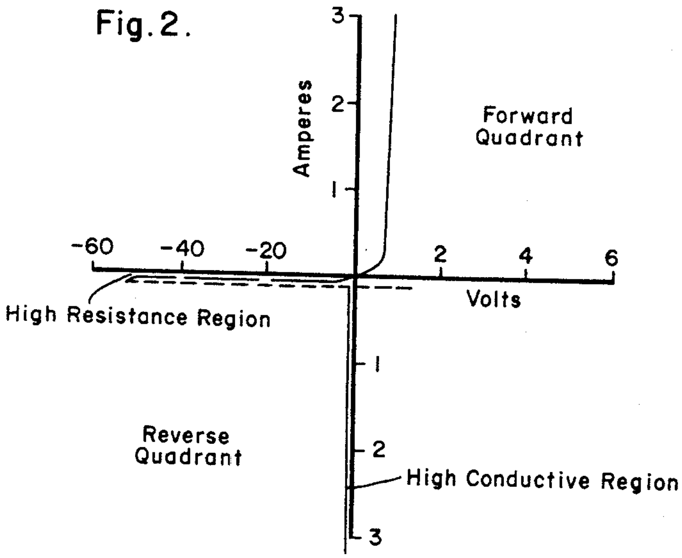
Fig. 2 is an operating characteristic of a hyperconductive diode to be utilized in this invention.

Referring now to Fig. 2, the curve shows how the hyperconductive diodes 60 and 70 respond to the application of different voltages. Considering the upper right or forward quadrant, when a forward voltage of the order of one voltage unit is applied, the current builds up to about 3 current units. When the voltage is reversed, it builds up in the reverse direction to about 55 voltage units with only a small fraction of a current unit of current flowing, and the diode subsequently becomes highly conductive or hyperconductive in the reverse direction and the voltage drops to about one voltage unit as shown in the lower left or reverse quadrant. The hyperconductive diode has thus become in the reverse direction a conductor with low ohmic resistance and the current then builds up rapidly to several current units.

As shown in the reverse quadrant, when the hyperconductive diode breaks down, the voltage drops along a substantially straight line to approximately one voltage unit, and very little power is dissipated in maintaining the diode highly conductive. The diode can be rendered highly resistant again by reducing the current below a minimum threshhold value and the voltage below the breakdown value. Consequently, the curve can be repeatedly followed as desired by properly controlling the magnitude of reverse current and voltage.

The breakdown or process of the diode becoming highly conductive in the reverse direction occurs within a small interval of time. Investigations have revealed that from the time of subjecting the hyperconductive diode to the necessary voltage in the reverse direction to render it highly conductive to the time when it sustains relatively high current at a low reverse voltage, comprises an interval of the order of $1/10$ of a microsecond. Further, it has been found that the breakdown of the hyperconductive diode in the reverse direction will respond to currents of a very wide range of frequencies, of the order of one megacycle.

Figure 3:
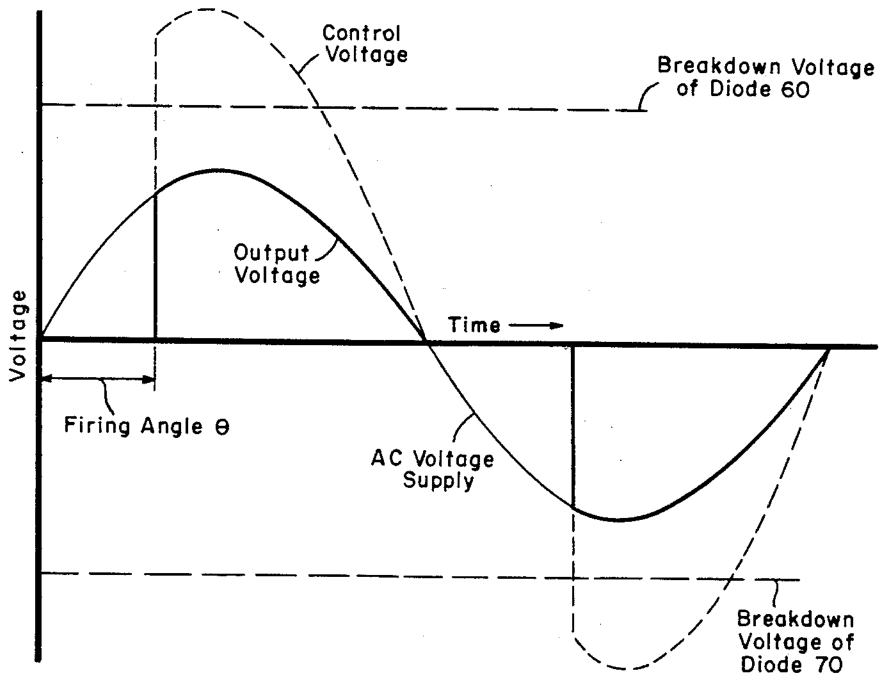
Fig. 3 is a graphical representation of waveforms present at selected points of the apparatus illustrated in Fig. 1.

Referring again to Fig. 1, the operation thereof will now be described with reference to the waveforms of Fig. 3 and Fig. 4. As shown in Fig. 3, the alternating current supply voltage is not of a sufficient magnitude to break down the hyperconductive diodes 60 and 70 in the reverse direction. Therefore, as long as the control circuit 80 contributes no additional voltage to break down the hyperconductive diodes 60 and 70 no current will flow through the load 53.

In denoting the direction or manner in which the windings have been wound upon their associated cores, the polarity dot convention has been utilized. The polarity dot convention indicates like instantaneous points of polarity with reference to the plurality of windings on each core. The polarity dot convention also indicates the direction of saturation. That is, current flowing into the polarity dot and of a winding disposed upon a saturable core will drive the associated core toward positive saturation. Current flowing out of the polarity dot end of a winding will drive the associated core away from positive saturation.

The secondary winding 43 of the transformer 40 is to be regarded as a source of voltage for the control circuit 80. On one half-cycle of the voltage supplied by the winding 43 the reactor 20 will be driven toward saturation and the reactor 30 will be driven away from positive saturation. Until one of the reactors 20 and 30 are saturated, the secondary windings 23 and 33 present very high impedances to the control circuit 80. However, upon saturation of one of the reactors 20 and 30, at a given firing angle $\theta$, the windings 23 and 33 will present a very low impedance and almost the entire voltage supplied by the secondary winding 43 of the transformer 40 may be applied to one of the hyperconductive diodes 60 and 70 depending upon the half-cycle of operation. This is shown in Fig. 3 where a control voltage with the firing angle $\theta$ is to be applied first to the diode 60 and on the next half-cycle the diode 70. The control voltage is sufficient to break the hyperconductive diodes 60 and 70 down in the reverse direction which allows a flow of current through the load 53.

The time during each half-cycle of the supply voltage applied at the terminals 51 and 52 when the reactors 20 and 30 saturate depends upon the magnitude of the alternating current input voltage applied to the input circuit 10 at the terminals 11 and 12. This input signal voltage is rectified and filtered by the action of the rectifier 13 and the capacitor 14. The larger the magnitude of input voltage the earlier in each half-cycle the reactors 20 and 30 will saturate. It is to be noted, of course, that a direct current input signal may be applied to the terminals 11 and 12 and the output load resistor 53 may be connected through a rectifier to the load circuit 50 in order to obtain the amplification of a direct current signal.

Figure 4:
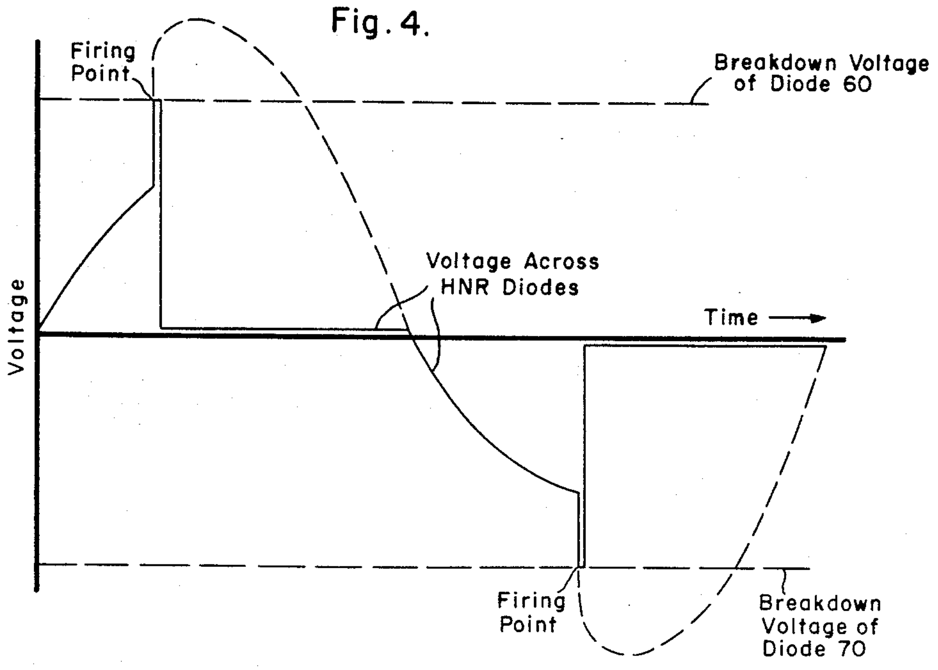
Fig. 4 is a graphical representation of waveforms present at other selected points of the apparatus of Fig. 1.

Fig. 4 shows the voltage across the hyperconductive diodes 60 and 70 during their respective half-cycles. The voltage across the diodes 60 and 70 rises in accordance with the alternating current supply voltage applied to the terminals 51 and 52 until the reactors 20 and 30 saturate. At this time the control voltage from the control circuit 80 raises the voltage across the hyperconductive diodes 60 and 70 during their respective half-cycles to above their breakdown voltages and the diodes 60 and 70 become highly conductive in the reverse direction with a low ohmic resistance.

Reviewing the operation of the amplifier illustrated in Fig. 1, we see that the supply voltage applied to the terminals 51 and 52 is small enough in magnitude so that the hyperconductive diodes 60 and 70 will not "fire" when no control voltage from the control circuit 80 is present. The saturable reactors 20 and 30 are designed to absorb the entire half-cycles of voltage applied by the transformer 40 if an input signal has not been applied to the terminals 11 and 12. The load 53 receives current only when the control voltage breaks the proper hyperconductive diode down. Current in the load 53 ceases to flow when the current through the hyperconductive diodes 60 and 70 is less than the sustaining current. When the terminal 51 of the supply voltage is positive, the hyperconductive diode 60 conducts for the portion of the half-cycle dictated by the control voltage. When the polarity of the supply voltage reverses so that terminal 52 is positive, the hyperconductive diode 70 controls the load current, subject to the control voltage.

The control voltage is a chopped sine wave, as illustrated in Fig. 3, whose firing angle $\theta$ is a function of the magnitude of the alternating current input signal. The series saturable reactors 20 and 30 control the firing angle $\theta$. As the magnitude of the rectified and filtered alternating current input voltage increases, the current to the control or primary windings 22 and 32 of the series saturable reactors 20 and 30 increases. As the current to the control or primary windings 22 and 32 of the reactors 20 and 30 increases, the firing angle $\theta$ decreases. The hyperconductive diodes 60 and 70 are then fired at the firing angle $\theta$ determined by the alternating current input voltage magnitude.

The circuit of Fig. 1 has the following advantages. Both halves of the alternating current supply voltage are controlled. Proportional control is obtained over the majority of each half-cycle of alternating current supply voltage. Each half-cycle of a supply voltage can be controlled to within a very few degrees of each zero. If a square wave switching voltage is applied to the control circuit 80 and load circuit 50, each half-cycle of supply voltage can be controlled to zero. The linearity of the amplifier is excellent. The chopped output from the series saturable reactors 20 and 30 fires the hyperconductive negative resistance diodes 60 and 70 at the correct part of the cycle regardless of the instantaneous value of the load voltage as is illustrated in Fig. 4. The power gain of the circuit may be made very large.

The power amplifier of Fig. 1 can be used, for example, in welding circuits to control heat to the weld. The amplifier can also be used to control the speed of a direct current motor if the output of the amplifier is rectified. The amplifier may also be used to amplify transducer outputs for amplification and alarm.

In conclusion, it is pointed out that while the illustrated example constitutes a practical embodiment of my invention, I do not limit myself to the exact details shown, since modification of the same may be effected without departing from the spirit and scope of this invention.

I claim as my invention:

1. An amplifier comprising; a load circuit; and a control circuit; means for connecting a source of voltage to said control circuit; said load circuit including a bridge arrangement with first and second hyperconductive diodes respectively in one pair of opposing legs and first and second rectifiers respectively in the other pair of opposing legs of said bridge arrangement; means connecting an alternating supply voltage and a load to a first pair of opposing terminals of said bridge arrangement; said hyperconductive diodes and said rectifiers being polarized in a reverse current direction to said alternating supply voltage; said first and second hyperconductive diodes having a predetermined breakdown level and having a hyperconductive region after breakdown occurs wherein a reverse voltage less than the breakdown level will sustain substantial current flow; and means connecting said control circuit to a second pair of opposing terminals of said bridge arrangement; said control circuit including saturable reactor means.

2. An amplifier comprising; a load circuit; a control circuit; means for connecting a source of voltage to said control circuit; and an input circuit; said load circuit including a bridge arrangement with first and second hyperconductive diodes respectively in one pair of opposing legs and first and second rectifiers respectively in the other pair of opposing legs of said bridge arrangement; means connecting an alternating supply voltage and a load to a first pair of opposing terminals of said bridge arrangement; said hyperconductive diodes and said rectifiers being polarized in a reverse current direction to said alternating supply voltage; said first and second hyperconductive diodes having a predetermined breakdown level and having a hyperconductive region after breakdown occurs wherein a reverse voltage less than the breakdown level will sustain substantial current flow; and means connecting said control circuit to a second pair of opposing terminals of said bridge arrangement; said control circuit including saturable reactor means, said input circuit being connected to control the degree of saturation of said saturable reactor means.

3. An amplifier comprising; a load circuit; a control circuit; and an input circuit; means for connecting a source of voltage to said control circuit; said load circuit including a bridge arrangement with first and second hyperconductive diodes respectively in one pair of opposing legs and first and second rectifiers respectively in the other pair of opposing legs of said bridge arrangement; means connecting an alternating supply voltage and a load to a first pair of opposing terminals of said bridge arrangement; said hyperconductive diodes and said rectifiers being polarized in a reverse current direction to said alternating supply voltage; said first and second hyperconductive diodes having a predetermined breakdown level and having a hyperconductive region after breakdown occurs wherein a reverse voltage less than the breakdown level will sustain substantial current flow; and means connecting said control circuit to a second pair of opposing terminals of said bridge arrangement; said control circuit including saturable reactor means, said input circuit being connected to control the degree of saturation of said saturable reactor means; said input circuit including means for rectifying and filtering an input signal.

4. An amplifier comprising; a load circuit; a control circuit; and an input circuit; said load circuit including a bridge arrangement with first and second hyperconductive diodes respectively in one pair of opposing legs and first and second rectifiers respectively in the other pair of opposing legs of said bridge arrangement; means connecting an alternating supply voltage and a load to a first pair of opposing terminals of said bridge arrangement; said hyperconductive diodes and said rectifiers being polarized in a reverse current direction to said alternating supply voltage; said first and second hyperconductive diodes having a predetermined breakdown level and having a hyperconductive region after breakdown occurs wherein a reverse voltage less than the breakdown level will sustain substantial current flow; means connecting said control circuit to a second pair of opposing terminals of said bridge arrangement; said control circuit including saturable reactor means, said input circuit being connected to control the degree of saturation of said saturable reactor means; and transformer means connecting a voltage from said load circuit to said control circuit.

5. An amplifier comprising; a load circuit; a control circuit; and an input circuit; said load circuit including a bridge arrangement with first and second hyperconductive diodes respectively in one pair of opposing legs and first and second rectifiers respectively in the other pair of opposing legs of said bridge arrangement; means connecting an alternating supply voltage and a load to a first pair of opposing terminals of said bridge arrangement; said hyperconductive diodes and said rectifiers being polarized in a reverse current direction to said alternating supply voltage; said first and second hyperconductive diodes having a predetermined breakdown level and having a hyperconductive region after breakdown occurs wherein a reverse voltage less than the breakdown level will sustain substantial current flow; means connecting said control circuit to a second pair of opposing terminals of said bridge arrangement; said control circuit including saturable reactor means; and transformer means connecting a voltage from said load circuit to said control circuit; said input circuit being connected to control the degree of saturation of said saturable reactor means; said input circuit including means for rectifying and filtering an input signal.

6. Switching apparatus comprising a load circuit adapted to be connected to a power supply, said load circuit including hyperconductive diode means blocking current flow in the load circuit, said diode means having a predetermined breakdown potential level and having a hyperconductive region after breakdown occurs wherein a reverse voltage less than the breakdown level will sustain substantial current flow, and control means including saturable reactor means and means for receiving an input signal, circuit means for connecting a source of voltage to said control means having a magnitude of voltage insufficient to cause saturation of said saturable reactor means, said circuit means connected in cooperation with said control means to saturate said saturable reactor means and raise the potential across said hyperconductive diode means above the breakdown potential level in response to said input signal.

7. Switching apparatus comprising a load circuit adapted to be connected to a power supply, said load circuit including hyperconductive diode means blocking current flow in the load circuit, said diode means having a predetermined breakdown potential level and having a hyperconductive region after breakdown occurs wherein a reverse voltage less than the breakdown level will sustain substantial current flow, and control means including saturable reactor means and means for receiving an input signal, circuit means for connecting a source of voltage to said control means having a magnitude of voltage insufficient to cause saturation of said saturable reactor means, said circuit means connected in cooperation with said control means to saturate said saturable reactor means and raise the potential across said hyperconductive diode means above the breakdown potential level in response to said input signal, the breakdown firing angle of said potential across the hyperconductive diode means being a function of the magnitude of said input signal.

8. Switching apparatus comprising a load circuit adapted to be connected to a power supply, said load circuit including hyperconductive diode means blocking current flow in the load circuit, said diode means having a predetermined breakdown potential level and having a hyperconductive region after breakdown occurs wherein a reverse voltage less than the breakdown level will sustain substantial current flow, and control means including saturable reactor means and means for receiving an input signal, circuit means for connecting a source of voltage to said control means in phase with said power supply and having a magnitude of voltage insufficient to cause saturation of said saturable reactor means, said circuit means connected in cooperation with said control means to saturate said saturable reactor means and raise the potential across said hyperconductive diode means above the breakdown potential level in response to said input signal.

9. Switching apparatus comprising a load circuit adapted to be connected to a power supply, said load circuit including hyperconductive diode means blocking current flow in the load circuit, said diode means having a predetermined breakdown potential level and having a hyperconductive region after breakdown occurs wherein a reverse voltage less than the breakdown level will sustain substantial current flow, and control means including saturable reactor means, means for receiving an alternating current input voltage including filtering means for providing an input signal to said control means for each half cycle of the alternating current input voltage, circuit means for connecting a second source of voltage to said control means in phase with said power supply and having magnitude of voltage insufficient to cause saturation of said saturable reactor means, said circuit means connected in cooperation with said control means to saturate said saturable reactor means and raise the potential across said hyperconductive diode means above the breakdown potential level in response to the magnitude of said first mentioned alternating current input voltage.

10. Switching apparatus comprising a load circuit adapted to be connected to a power supply, said load circuit including hyperconductive diode means blocking current flow in the load circuit, said diode means having a predetermined breakdown potential level and having a hyperconductive region after breakdown occurs wherein a reverse voltage less than the breakdown level will sustain substantial current flow, and control means including saturable reactor means and means for receiving an input signal, transformer means connecting a voltage from said load circuit to said control means having a magnitude of voltage insufficient to cause saturation of said saturable reactor means, said circuit means connected in cooperation with said control means to saturate said saturable reactor means and raise the potential across said hyperconductive diode means above the breakdown potential level in response to said input signal.

References Cited in the file of this patent

UNITED STATES PATENTS

| | | |
|---|---|---|
| 2,783,315 | Ramey | Feb. 26, 1957 |
| 2,825,820 | Sims | Mar. 4, 1958 |
| 2,830,196 | Eckert | Apr. 8, 1958 |